(12) United States Patent
Mimura

(10) Patent No.: US 11,552,615 B2
(45) Date of Patent: Jan. 10, 2023

(54) ACOUSTIC WAVE DEVICE

(71) Applicant: Murata Manufacturing Co., Ltd., Nagaokakyo (JP)

(72) Inventor: Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 593 days.

(21) Appl. No.: 16/589,199

(22) Filed: Oct. 1, 2019

(65) Prior Publication Data
US 2020/0036357 A1    Jan. 30, 2020

Related U.S. Application Data

(63) Continuation of application No. PCT/JP2018/012964, filed on Mar. 28, 2018.

(30) Foreign Application Priority Data

Apr. 26, 2017 (JP) .............................. JP2017-087094

(51) Int. Cl.
*H03H 9/02* (2006.01)
*H03H 9/54* (2006.01)
*H03H 9/64* (2006.01)
*H03H 7/01* (2006.01)

(52) U.S. Cl.
CPC ...... *H03H 9/02559* (2013.01); *H03H 7/0161* (2013.01); *H03H 9/54* (2013.01); *H03H 9/64* (2013.01)

(58) Field of Classification Search
CPC ......... H03H 9/02559; H03H 9/54; H03H 9/64
See application file for complete search history.

(56) References Cited

U.S. PATENT DOCUMENTS

2008/0179989 A1* 7/2008 Ogami ............... H03H 9/02559
                                                    310/313 A
2014/0145556 A1    5/2014 Kadota
2014/0152146 A1    6/2014 Kimura et al.
(Continued)

FOREIGN PATENT DOCUMENTS

CN    103283147 A    9/2013
CN    104205629 A    12/2014
(Continued)

OTHER PUBLICATIONS

Official Communication issued in International Patent Application No. PCT/JP2018/012964, dated Jun. 19, 2018.
Office Action in CN201880026037.8, dated Nov. 7, 2022, 7 pages.

*Primary Examiner* — Samuel S Outten
(74) *Attorney, Agent, or Firm* — Keating & Bennett, LLP

(57) ABSTRACT

An acoustic wave device includes a piezoelectric body made of lithium niobate and disposed directly or indirectly on a supporting substrate, and IDT electrode disposed directly or indirectly on the piezoelectric body. When the wavelength of an acoustic wave that is determined by a pitch of electrode fingers of the IDT electrode is denoted by $\lambda$, the thickness of the piezoelectric body is equal to or less than about $1\lambda$. The acoustic wave device uses the plate wave S0 mode propagating in the piezoelectric body. The Euler angles of the lithium niobate are $(0°\pm10°, \theta, 90°\pm10°)$, provided that $\theta$ is from about 0° to about 180° inclusive.

20 Claims, 15 Drawing Sheets

(56) References Cited

U.S. PATENT DOCUMENTS

| | | |
|---|---|---|
| 2015/0028720 A1 | 1/2015 | Kando |
| 2015/0061466 A1 | 3/2015 | Kimura et al. |
| 2018/0152171 A1 | 5/2018 | Kishimoto et al. |

FOREIGN PATENT DOCUMENTS

| | | |
|---|---|---|
| CN | 104303417 A | 1/2015 |
| WO | 2012/086441 A1 | 6/2012 |
| WO | 2013/021948 A1 | 2/2013 |
| WO | 2016/047255 A1 | 3/2016 |
| WO | 2017/043151 A1 | 3/2017 |

\* cited by examiner

ACOUSTIC WAVE DEVICE

CROSS REFERENCE TO RELATED APPLICATIONS

This application claims the benefit of priority to Japanese Patent Application No. 2017-087094 filed on Apr. 26, 2017 and is a Continuation Application of PCT Application No. PCT/JP2018/012964 filed on Mar. 28, 2018. The entire contents of each application are hereby incorporated herein by reference.

BACKGROUND OF THE INVENTION

1. Field of the Invention

The present invention relates to an acoustic wave device that uses S0 mode acoustic plate waves.

2. Description of the Related Art

International Publication No. WO2012/086441 A1 discloses an acoustic wave device that uses plate waves. In the acoustic wave device described in International Publication No. WO2012/086441 A1, a thin piezoelectric body is stacked on a supporting substrate with an acoustic reflection layer interposed therebetween. An IDT (interdigital transducer) electrode is disposed on the piezoelectric body. It is stated in International Publication No. WO2012/086441 A1 that, when lithium niobate is used for the piezoelectric body and S0 mode plate waves are used, the Euler angles of lithium niobate are preferably (90°, 90°, 25° to 40°).

In the acoustic wave device described in International Publication No. WO2012/086441 A1 that uses S0 mode acoustic plate waves, when the Euler angles are set to (90°, 90°, 25° to 40°), loss may increase due to the influence of a power flow angle.

SUMMARY OF THE INVENTION

Preferred embodiments of the present invention reduce loss in acoustic wave devices that each use S0 mode acoustic plate waves.

An acoustic wave device according to a preferred embodiment of the present invention includes a supporting substrate; a piezoelectric body made of lithium niobate and disposed directly or indirectly on the supporting substrate; and an interdigital transducer (IDT) electrode disposed directly or indirectly on the piezoelectric body. The acoustic wave device uses a plate wave S0 mode propagating in the piezoelectric body. The thickness of the piezoelectric body is equal to or less than about $1\lambda$, where $\lambda$ is the wavelength of an acoustic wave that is determined by the pitch of electrode fingers of the IDT electrode. The Euler angles of the lithium niobate are $(0°\pm10°, \theta, 90°\pm10°)$, and $\theta$ in the Euler angles is within the range of from about 0° to about 180° inclusive.

Preferably, in an acoustic wave device according to a preferred embodiment of the present invention, $\theta$ in the Euler angles is within the range of from about 7° to about 66° inclusive. In this case, the electromechanical coupling coefficient of the plate wave S0 mode can be increased.

Preferably, in an acoustic wave device according to a preferred embodiment of the present invention, $T \times r$ satisfies the following formula (1):

$$T \times r \geq 0.1821 \times T_{LN}^2 + 0.1055 \times T_{LN} + 0.0082, \quad \text{formula (1)}$$

where $T_{LN}$ is the thickness of the piezoelectric body that is normalized by the wavelength $\lambda$ of the acoustic wave, T is the film thickness of the IDT electrode that is normalized by the wavelength $\lambda$ of the acoustic wave, $\rho$ is the density of a metal used for the IDT electrode, $\rho_{Al}$ is the density of Al, and r is $\rho/\rho_{Al}$, which is the ratio of the density of the metal used for the IDT electrode to the density of Al.

In this case, the position of a spurious response can be shifted to the outside of the necessary band.

Preferably, in an acoustic wave device according to a preferred embodiment of the present invention, $\theta$ in the Euler angles is within the range of from about 67° to about 104° inclusive. In this case, the electromechanical coupling coefficients of a spurious mode can be reduced.

Preferably, in an acoustic wave device according to a preferred embodiment of the present invention, $T \times r$ satisfies the following formula (2):

$$T \times r \geq 0.5902 \times T_{LN}^2 - 0.2133 \times T_{LN} + 0.0248, \quad \text{formula (2)}$$

where $T_{LN}$ is the thickness of the piezoelectric body that is normalized by the wavelength $\lambda$ of the acoustic wave, T is the film thickness of the IDT electrode that is normalized by the wavelength $\lambda$ of the acoustic wave, $\rho$ is the density of a metal used for the IDT electrode, $\rho_{Al}$ is the density of Al, and r is $\rho/\rho_{Al}$, which is the ratio of the density of the metal used for the IDT electrode to the density of Al.

In this case, the position of a spurious response can be shifted to the outside of the necessary band.

Preferably, in an acoustic wave device according to a preferred embodiment of the present invention, $\theta$ in the Euler angles is within the range of from about 116° to about 137° inclusive. In this case, the electromechanical coupling coefficient of the plate wave S0 mode can be increased.

Preferably, in an acoustic wave device according to a preferred embodiment of the present invention, $T \times r$ satisfies the following formula (3):

$$T \times r \geq 0.6307 \times T_{LN}^2 - 0.0858 \times T_{LN} + 0.0110, \quad \text{formula (3)}$$

where $T_{LN}$ is the thickness of the piezoelectric body that is normalized by the wavelength $\lambda$ of the acoustic wave, T is the film thickness of the IDT electrode that is normalized by the wavelength $\lambda$ of the acoustic wave, $\rho$ is the density of a metal used for the IDT electrode, $\rho_{Al}$ is the density of Al, and r is $\rho/\rho_{Al}$, which is the ratio of the density of the metal used for the IDT electrode to the density of Al.

In this case, the position of a spurious response can be shifted to the outside of the necessary band.

In in an acoustic wave device according to a preferred embodiment of the present invention, no particular limitation is imposed on the supporting structure for the piezoelectric body as long as the piezoelectric body is supported such that the plate wave S0 mode is confined within the piezoelectric body.

In an acoustic wave device according to a preferred embodiment of the present invention, the acoustic wave device includes a cavity between the supporting substrate and the piezoelectric body at a position of the IDT electrode in plan view.

In an acoustic wave device according to a preferred embodiment of the present invention, the supporting substrate is made of a high-acoustic velocity material in which the acoustic velocity of a bulk wave propagating therein is higher than the acoustic velocity of an acoustic wave propagating in the piezoelectric body.

In an acoustic wave device according to a preferred embodiment of the present invention, the acoustic wave device further includes a layer made of a high-acoustic velocity material in which the acoustic velocity of a bulk wave propagating therein is higher than the acoustic velocity of an acoustic wave propagating in the piezoelectric body, the layer being stacked between the supporting substrate and the piezoelectric body.

In an acoustic wave device according to a preferred embodiment of the present invention, the acoustic wave device further includes a low-acoustic velocity material layer in which the acoustic velocity of a bulk wave propagating therein is lower than the acoustic velocity of the acoustic wave propagating in the piezoelectric body, the low-acoustic velocity material layer being stacked between the high-acoustic velocity material and the piezoelectric body.

In an acoustic wave device according to a preferred embodiment of the present invention, the acoustic wave device further includes an acoustic reflection layer that supports the piezoelectric body and is disposed between the supporting substrate and the piezoelectric body, and the acoustic reflection layer includes a low-acoustic impedance layer having a lower acoustic impedance and a high-acoustic impedance layer having a higher acoustic impedance.

In the acoustic wave devices according to preferred embodiments of the present invention that each use S0 mode acoustic plate waves, loss is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing specific preferred embodiments of the present invention with reference to the drawings.

It is to be noted that the preferred embodiments described in the present description are only illustrative and the structure in each preferred embodiment may be partially replaced or combined with the structure in a different preferred embodiment.

First Preferred Embodiment

Figure 1:
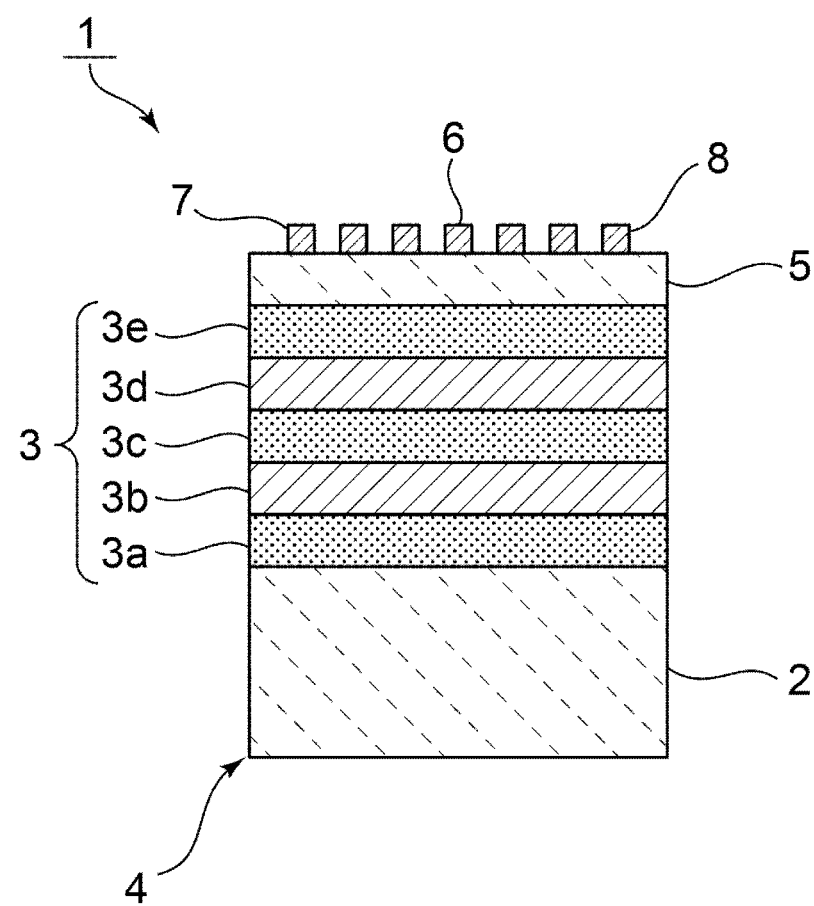
FIG. 1 is an elevational cross-sectional view of an acoustic wave device according to a first preferred embodiment of the present invention.

FIG. 1 is an elevational cross-sectional view of an acoustic wave device according to a first preferred embodiment of the present invention. In the acoustic wave device 1, a piezoelectric body 5 is stacked indirectly on a supporting substrate 2. The piezoelectric body 5 may be stacked directly on the supporting substrate 2. An interdigital transducer (IDT) electrode 6 and reflectors 7 and 8 are provided on the piezoelectric body 5. The IDT electrode 6 and the reflectors 7 and 8 are stacked directly on the piezoelectric body 5 but may be stacked indirectly on the piezoelectric body 5. The reflectors 7 and 8 are disposed on opposite sides of the IDT electrode 6 in the propagation direction of acoustic waves. A one-port acoustic wave resonator is thus provided.

A wavelength determined by the pitch of electrode fingers of the IDT electrode 6 is denoted by λ. The piezoelectric body 5 is preferably made of lithium niobate and has a thickness of about 1λ or less, for example. The acoustic wave device 1 uses a plate wave S0 mode propagating in the thin piezoelectric body 5. In the acoustic wave device 1 in the present preferred embodiment, the Euler angles of lithium niobate forming the piezoelectric body 5 are preferably (0°, θ, 90°).

The plate wave is a generic term for various waves excited in a thin piezoelectric plate with a film thickness equal to or less than about 1λ, where λ is the wavelength of the excited plate waves. Any structure to confine waves can be used so long as the waves are concentrated within the thin piezoelectric plate. For example, a membrane supporting structure including a cavity below the thin piezoelectric plate may preferably be used. Other structures may be used, such as: a structure in which a layer that reflects plate waves is provided near the thin piezoelectric plate, e.g., a structure including the acoustic reflection layer shown in International Publication No. WO2012/086441 A1; and a structure in which a medium in which the acoustic velocity of bulk waves is higher than the acoustic velocity of plate waves, i.e., a high-acoustic velocity material described later, is disposed to reflect acoustic waves by total reflection.

Figure 2:
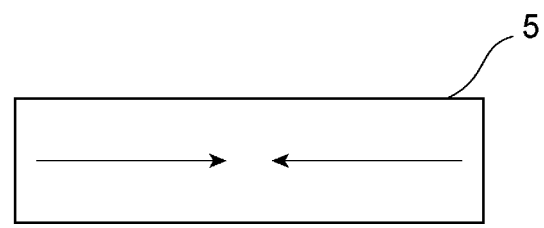
FIG. 2 a schematic illustration showing a plate wave S0 mode propagating in a piezoelectric body.

FIG. 2 a schematic illustration showing the plate wave S0 mode propagating in the piezoelectric body 5. In the plate wave S0 mode, its main displacement component is parallel or substantially parallel to the propagation direction of acoustic waves in the piezoelectric body 5 as shown by arrows, and no nodes are present in the thickness direction of the piezoelectric body 5.

In the lithium niobate used in the present preferred embodiment, the plate wave S0 mode is excited at an acoustic velocity of about 6,000 m/s to about 7,000 m/s. The acoustic velocity of an acoustic wave is represented by the product of the frequency at which the acoustic wave is excited and the wavelength of the acoustic wave. The frequency at which the acoustic wave is excited is the frequency at which the acoustic wave device operates. The frequency at which the acoustic wave device operates is, for example, a frequency in a pass band in the case of a band-pass filter, a frequency in a stop band in the case of a band-elimination filter, or a resonant frequency in the case of an acoustic wave resonator.

The wavelength of an acoustic wave is a length determined by the pitch of the electrode fingers of the IDT electrode provided on the surface of the piezoelectric body 5 in the acoustic wave device. For example, the center-to-center distance between adjacent electrode fingers connected to different potentials is preferably about λ/2. Therefore, λ is the center-to-center distance between closest electrode fingers connected to the same potential. When the pitch of electrode fingers in one IDT electrode is nonuniform, λ is determined in consideration of the average of the pitches of the IDT electrode.

When the piezoelectric body 5 used in the acoustic wave device is made of lithium niobate and the product of the wavelength of the acoustic wave and the above-determined frequency at which the acoustic wave is excited is about 6,000 m/s to about 7,000 m/s, it is recognized that the acoustic wave device uses the plate wave S0 mode.

The supporting structure 4 confines the plate wave S0 mode within the piezoelectric body 5. In the present preferred embodiment, the supporting structure 4 includes the supporting substrate 2 and an acoustic reflection layer 3 stacked on the supporting substrate 2. The piezoelectric body 5 is stacked on the acoustic reflection layer 3. The acoustic reflection layer 3 includes low-acoustic impedance layers 3a, 3c, and 3e having a lower acoustic impedance and high-acoustic impedance layers 3b and 3d having a higher acoustic impedance. The low-acoustic impedance layers 3a, 3c, and 3e and the high-acoustic impedance layers 3b and 3d are stacked alternately in the thickness direction.

In the present preferred embodiment, the low-acoustic impedance layers 3a, 3c, and 3e are preferably made of, for example, SiO$_2$ (silicon oxide). The high-acoustic impedance layers 3b and 3d are preferably made of, for example, Pt (platinum). The materials of the low-acoustic impedance layers 3a, 3c, and 3e and the high-acoustic impedance layers 3b and 3d are not limited to these materials, and any suitable materials may be used, as long as the above described relative magnitude relationship is satisfied.

The supporting substrate 2 is preferably made of, for example, Si (silicon). Any suitable material may be used for the supporting substrate 2 as long as it can support the acoustic reflection layer 3.

Second Preferred Embodiment

Figure 28:
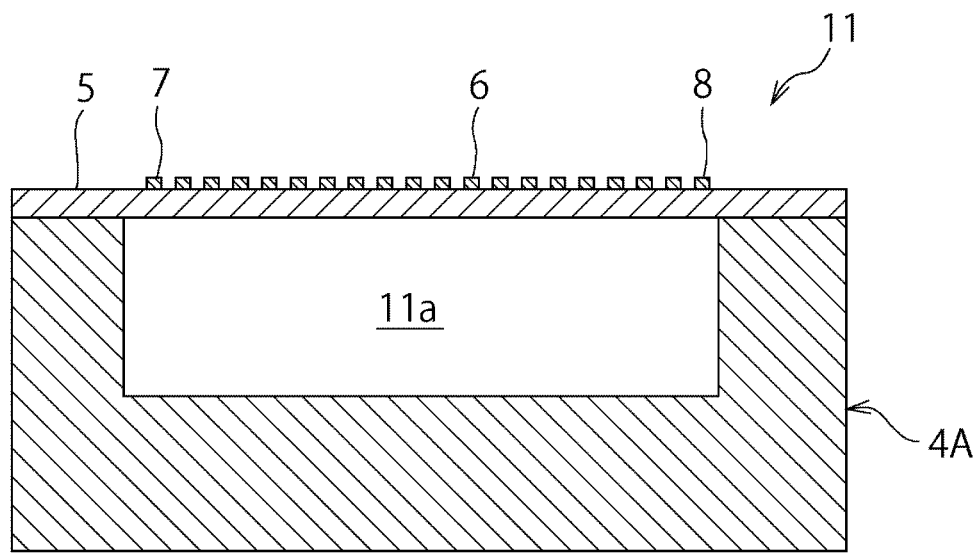
FIG. 28 is a schematic elevational cross-sectional view showing an acoustic wave device according to a second preferred embodiment of the present invention.

Referring to FIG. 28, an acoustic wave device in a second preferred embodiment of the present invention will be described. In the acoustic wave device 11 in the second preferred embodiment shown in FIG. 28, a cavity 11a is provided in a supporting substrate 4A. The piezoelectric body 5 is supported by the supporting substrate 4A such that the cavity 11a is disposed below the piezoelectric body 5. Since the cavity 11a is disposed below the piezoelectric body 5, the plate wave S0 mode excited in the piezoelectric body 5 is confined within the piezoelectric body 5.

Third Preferred Embodiment

Figure 29:
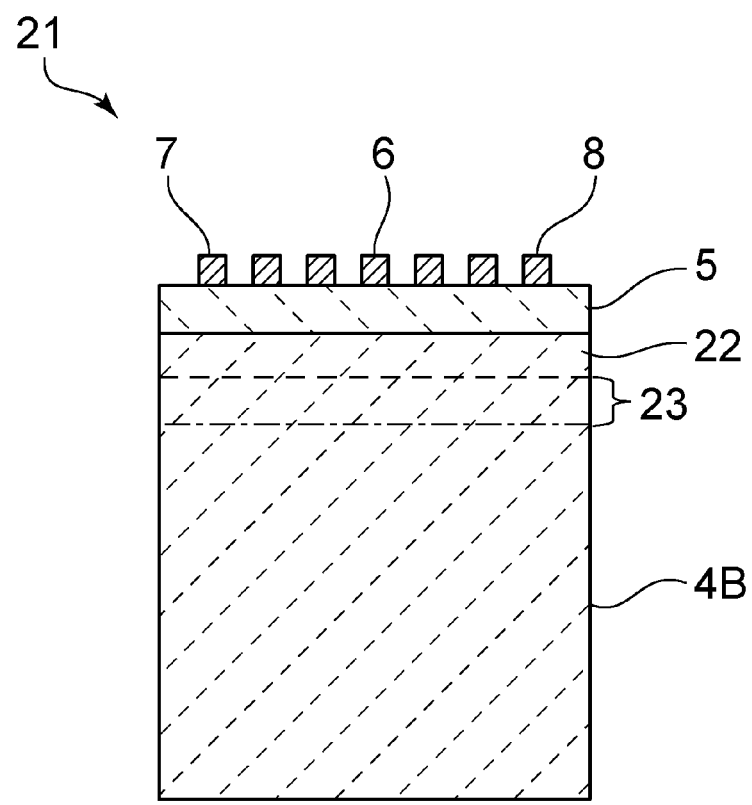
FIG. 29 is an elevational cross-sectional view of an acoustic wave device according to a third preferred embodiment of the present invention.

In an acoustic wave device 21 in a third preferred embodiment of the present invention shown in FIG. 29, a supporting substrate 4B is a high-acoustic velocity material layer in which the acoustic velocity of bulk waves propagating therein is higher than the acoustic velocity of acoustic waves propagating in the piezoelectric body 5. When the supporting substrate 4B is defined by the high-acoustic velocity material layer, the plate wave S0 mode can be confined within the piezoelectric body 5, and its energy can be concentrated in the piezoelectric body 5.

In the acoustic wave device 21, the supporting substrate 4B is preferably made of the high-acoustic velocity material. However, as shown by a broken line in FIG. 29, a low-acoustic velocity material layer 22 may be provided between the piezoelectric body 5 and the high-acoustic velocity material. The low-acoustic velocity material layer 22 is a layer made of a low-acoustic velocity material in which the acoustic velocity of bulk waves propagating therein is lower than the acoustic velocity of the plate wave S0 mode.

A high-acoustic velocity material layer 23 shown by a dash-dot line in FIG. 29 may be further provided between the supporting substrate 4B and the low-acoustic velocity material layer 22. In this case, the supporting substrate 4B may be made of a material other than the high-acoustic velocity material.

No particular limitation is imposed on the high-acoustic velocity material and the low-acoustic velocity material, as long as the above-described acoustic velocity relationship is satisfied. For example, a dielectric such as SiO$_2$ or SiON may be used for the low-acoustic velocity material layer. The high-acoustic velocity material layer may be made of, for example, a dielectric such as Al$_2$O$_3$, SiN, AlN, SiC, diamond-like carbon, or diamond, a metal, or a semiconductor.

A plurality of low-acoustic velocity material layers and a plurality of high-acoustic velocity material layers may be stacked alternately. No particular limitation is imposed on the number of low-acoustic velocity material layers stacked and the number of high-acoustic velocity material layers stacked.

EXAMPLE 1 AND COMPARATIVE EXAMPLE 1

Acoustic wave devices in an Example 1 as an Example of the first preferred embodiment and a Comparative Example 1 were produced in the following manner, and their power flow angle was determined.

The power flow angle PFA at given Euler angles ($\phi$, $\theta$, $\Psi$) was determined from the following formula using the phase velocity $V_\Psi$ of an acoustic wave at a propagation angle $\Psi$ and the phase velocities $V_{\Psi-\delta}$ and $V_{\Psi+\delta}$ of acoustic waves at angles $\Psi-\delta$ and $\Psi+\delta$ deviating a small angle $\delta$ (rad) from $\Psi$.

$$PFA = \tan^{-1}((V_{\Psi+\delta} - V_{\Psi-\delta})/(2 \times V_\Psi \times \delta))$$

Figure 3:
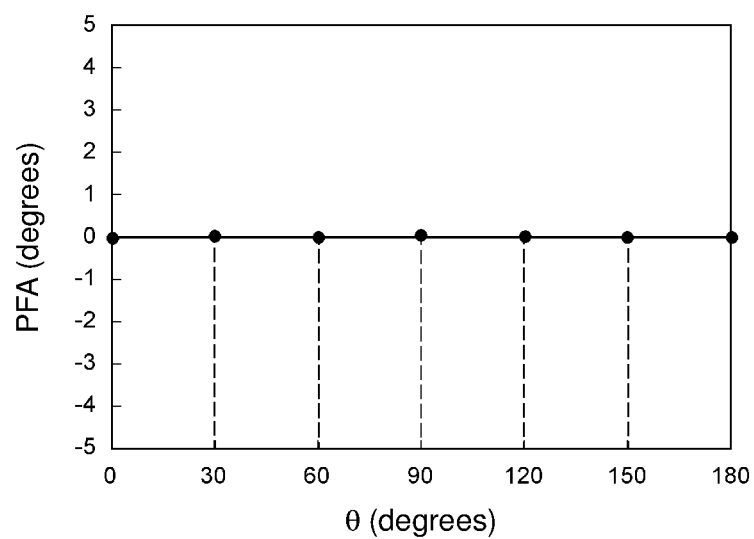
FIG. 3 is a graph showing the relationship between θ in the Euler angles and a power flow angle PFA in Example 1.

In Example 1, the IDT electrode were made of Al, and the thickness of the Al film was set to about 0.05λ. The duty ratio of the IDT electrode was set to about 0.50. The thickness of the piezoelectric body 5 was set to about 0.2λ. The thickness of the low-acoustic impedance layers 3a, 3c, and 3e was set to about 0.14λ, and the thickness of the high-acoustic impedance layers 3b and 3d was set to about 0.09λ. In Example 1, a plurality of acoustic wave devices in which θ in the Euler angles (0°, θ, 90°) was set to about 0°, about 30°, about 60°, about 90°, about 120°, about 150°, or about 180° were produced. The relationship between θ in the Euler angles and the power flow angle PFA in these acoustic wave devices is shown in FIG. 3. As shown in FIG. 3, when the Euler angles were (0°, θ, 90°), the power flow angle was about 0° irrespective of the value of θ.

Figure 4:
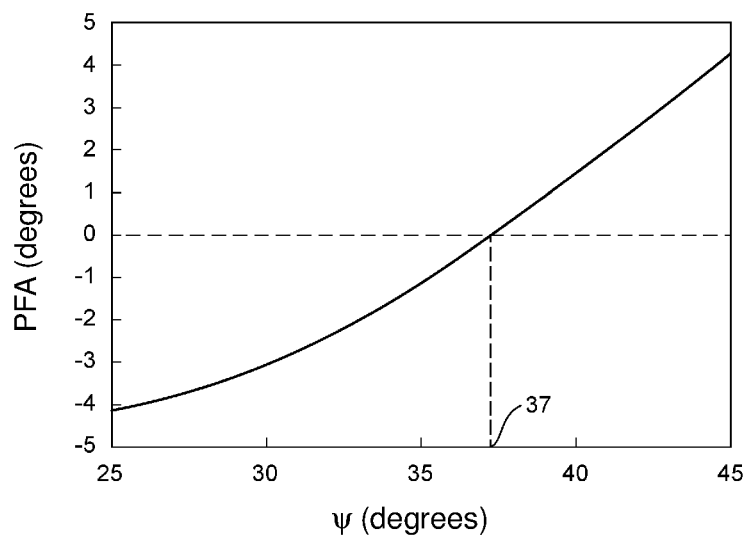
FIG. 4 is a graph showing the relationship between Ψ in the Euler angles and the power flow angle PFA in Comparative Example 1.

In Comparative Example 1, a plurality of acoustic wave devices were produced in the same or substantially the same manner as in Example 1, except that the Euler angles of lithium niobate were set to (90°, 90°, $\Psi$) and $\Psi$ was changed in the range of from about 25° to about 44° inclusive. The relationship between $\Psi$ in the Euler angles and the power flow angle PFA in Comparative Example 1 is shown in FIG. 4. As is clear from FIG. 4, in Comparative Example 1, the power flow angle PFA is about 0° at around $\Psi$=about 37°. However, the absolute value of the power flow angle PFA is large in other regions. In the acoustic wave devices in Comparative Example 1, the power flow angle PFA is not about 0° when $\Psi \neq 37°$. Therefore, the propagation direction of the energy of acoustic waves deviates from a direction orthogonal or substantially orthogonal to the electrode fingers of the IDT electrode, and an increase in loss occurs. However, in Example 1, the Euler angles are (0°, θ, 90°), and the power flow angle PFA is 0° at any value of θ, as described above. Therefore, the propagation direction of the energy of acoustic waves coincides with the direction orthogonal or substantially orthogonal to the electrode fingers of the IDT electrode, so that the loss can be reduced.

Figure 5:
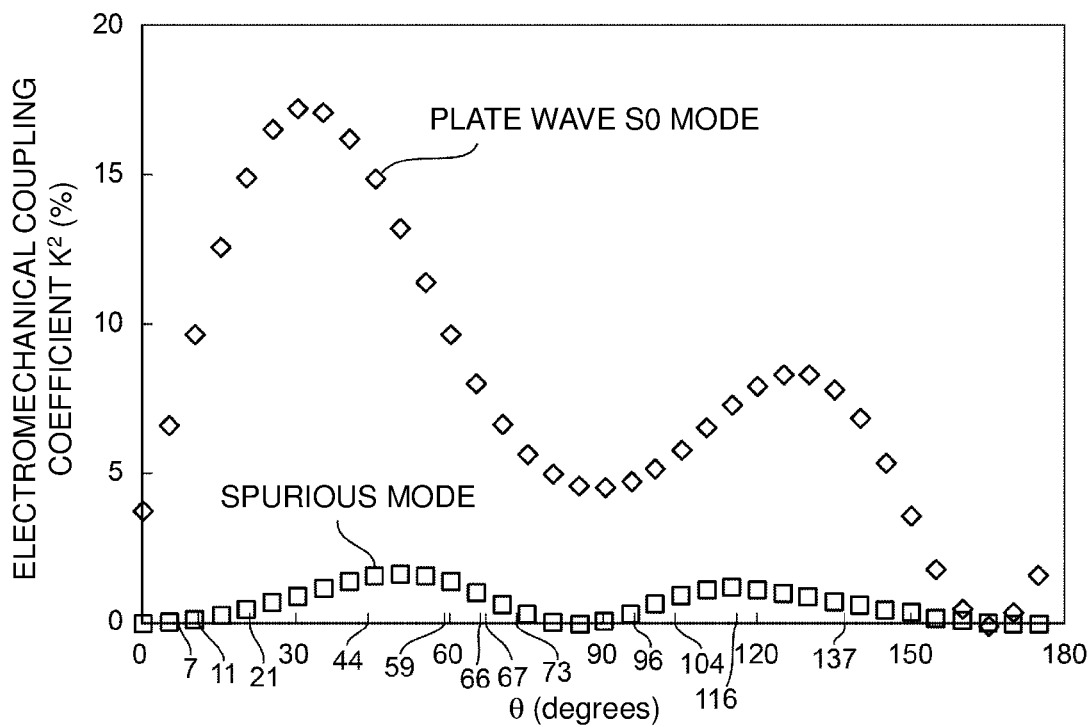
FIG. 5 is a graph showing the relationship between θ in the Euler angles and the electromechanical coupling coefficient of each of the plate wave S0 mode and a spurious mode in Example 1.

FIG. 5 is a graph showing the relationship between θ in the Euler angles and the electromechanical coupling coefficient of the plate wave S0 mode and the relationship between θ and the electromechanical coupling coefficient of a spurious mode in the vicinity of the plate wave S0 mode in the acoustic wave devices in Example 1 that can reduce the loss.

The electromechanical coupling coefficient K$^2$ was determined using formula (A) below. In formula (A), Fr represents a resonant frequency, and Fa represents an anti-resonant frequency.

$$K^2 = (\pi/2)(Fr/Fa)\{\cot(\pi/2 \cdot Fr/Fa)\} \qquad \text{formula (A)}$$

In a preferred range of θ in the Euler angles, the electromechanical coupling coefficient of the plate wave S0 mode is large, and the electromechanical coupling coefficient of the spurious mode is small. As seen in FIG. 5, such a range of θ includes the following ranges. Preferably, θ in the Euler angles is within the range of, for example, from about 7° to about 66° inclusive and within the range of from about 116° to about 137° inclusive. In this case, the electromechanical coupling coefficient $K^2$ of the plate wave S0 mode can be about 7.5% or more. The resonant frequency Fr and the anti-resonant frequency Fa were determined using formula (A), and then the band width ratio (Fa−Fr)/Fr (%) of a resonator was determined. A $K^2$ value of about 7.5% corresponds to a resonator band width ratio of about 3.2%. The band width ratio of a filter that can be produced using a resonator substantially coincides with the band width ratio of the resonator. Therefore, when a resonator with a $K^2$ of about 7.5% is used, a filter with a band wider than LTE-Band 2 with a band width ratio of about 3.1% can be produced. More preferably, θ in the Euler angles is within the range of, for example, from about 11° to about 59° inclusive. In this case, the electromechanical coupling coefficient $K^2$ can be about 10% or more. A $K^2$ of about 10% corresponds to a resonator band width ratio of about 4.4%. Therefore, when this resonator is used, a filter with a band wider than LTE-Band 3 with a band width ratio of about 4.2% can be produced. More preferably, θ in the Euler angles is within the range of, for example, from about 21° to about 44° inclusive. In this case, the electromechanical coupling coefficient $K^2$ of the plate wave S0 mode can be about 15% or more. A $K^2$ of about 15% corresponds to a resonator band width ratio of about 6.9%. Therefore, when this resonator is used, a filter with a band wider than LTE-Band 28 with a band width ratio of about 6.2% can be produced.

To reduce the electromechanical coupling coefficient of the spurious mode, it is preferable that θ in the Euler angles is within the range of, for example, from about 67° to about 104° inclusive. In this case, the electromechanical coupling coefficient $K^2$ of the spurious mode can be about 1.0% or less, and the magnitude of the spurious response can be sufficiently small. More preferably, θ in the Euler angles is within the range of, for example, from about 73° to about 96° inclusive. In this case, the electromechanical coupling coefficient $K^2$ of the spurious mode can be about 0.5% or less, and the magnitude of the spurious response can be further reduced.

EXAMPLES 2 AND 3

An acoustic wave device in Example 2 as an example in the first preferred embodiment was obtained in the same or substantially the same manner as in Example 1 except that the Euler angles of lithium niobate in the acoustic wave devices in Example 1 were set to (0°, 30°, 90°) and the thickness of the Al (aluminum) film forming the IDT electrode 6 was changed to about 0.06λ.

In Example 3, the same or substantially the same acoustic wave device as that in Example 2 was obtained except that the thickness of the Al film was changed to about 0.02λ.

Figure 6:
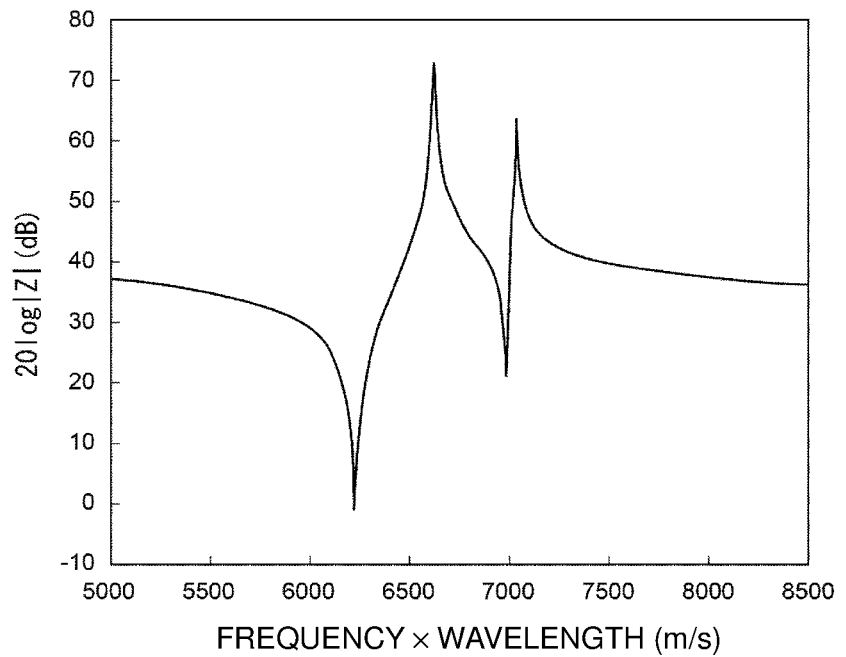
FIG. 6 is a graph showing the resonance characteristics of an acoustic wave device in Example 2.
Figure 7:
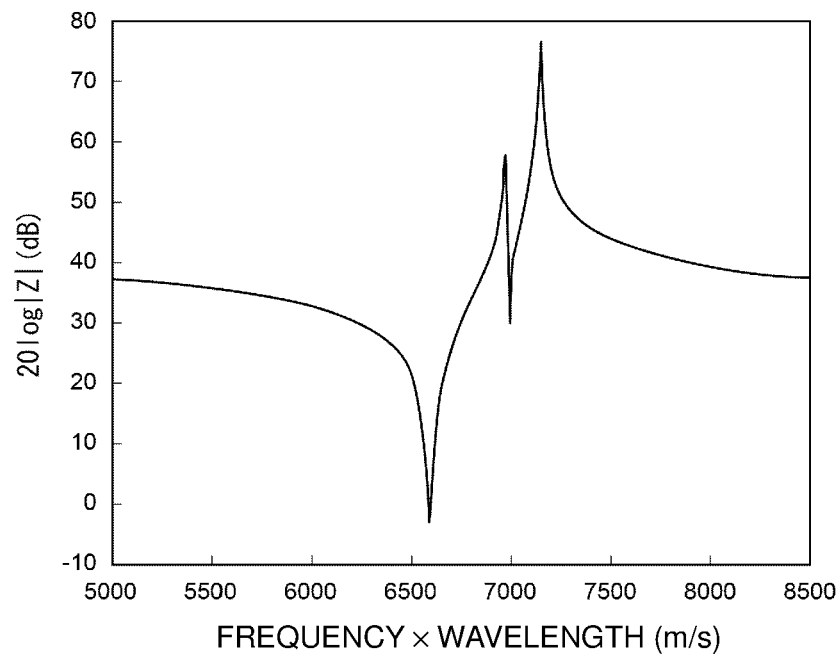
FIG. 7 is a graph showing the resonance characteristics of an acoustic wave device in Example 3.

FIG. 6 is a graph showing the resonance characteristics of the acoustic wave device in Example 2, and FIG. 7 is a graph showing the resonance characteristics of the acoustic wave device in Example 3.

In the acoustic wave devices in Examples 2 and 3, the Euler angles of lithium niobate are (0°, 30°, 90°). Therefore, in the acoustic wave devices in Examples 2 and 3, as in the acoustic wave device in Example 1, the electromechanical coupling coefficient of the plate wave S0 mode is large. Thus, also when the acoustic wave devices in Examples 2 and 3 are used, wide-band bandpass filters can be produced.

As is clear from FIG. 7, in Example 3, a spurious response appears between the resonant frequency and the anti-resonant frequency. However, as shown in FIG. 6, in Example 2, the spurious response is shifted to the high-frequency side higher than the anti-resonant frequency. For example, no spurious response appears in the frequency band between the resonant frequency and the anti-resonant frequency. Therefore, with Example 2, resonance characteristics better than those in Example 3 can be obtained.

The inventor of preferred embodiments of the present invention has conducted extensive studies on the spurious response and discovered that, when the symmetry of the piezoelectric body 5 is broken, the spurious response occurs due to disagreement between the upper stop band edge when the IDT electrode is open-circuited and the upper stop band edge when the IDT electrode is short-circuited. Therefore, by increasing the reflection coefficient per electrode finger to increase the stop band width, the spurious response can be shifted to the high-frequency side higher than the anti-resonant frequency. The inventor of preferred embodiments of the present invention has conducted studies in this regard and discovered that, by increasing the film thickness of the IDT electrode 6 and reducing the thickness of the lithium niobate film of the piezoelectric body 5, the reflection coefficient per electrode finger can be increased and the spurious response can be shifted to the high-frequency side.

Figure 8:
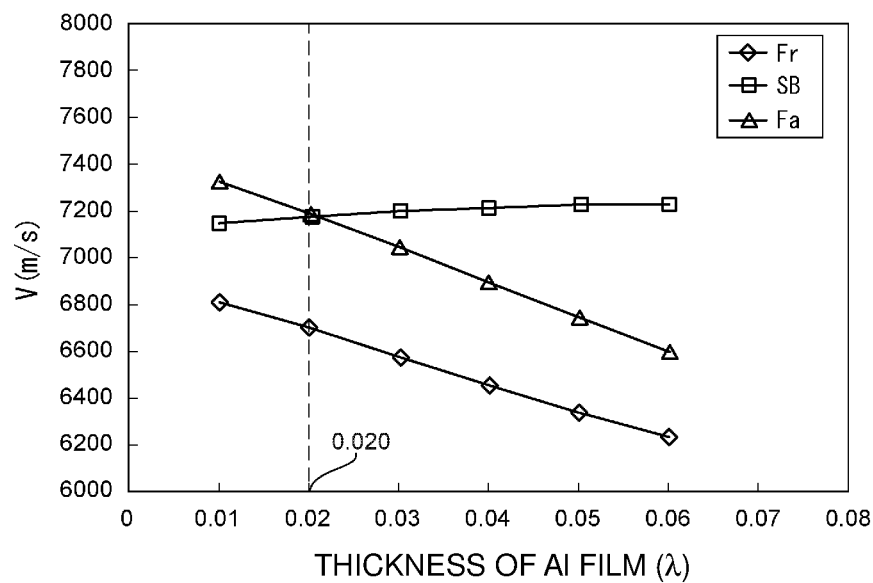
FIG. 8 is a graph showing the relationship between the thickness of an Al film and the acoustic velocity at each of a resonant frequency Fr, a frequency SB at an upper stop band edge, and an anti-resonant frequency Fa when the Euler angles of lithium niobate are (0°, 30°, 90°) and the thickness of a piezoelectric body made of lithium niobate is about 0.10λ.
Figure 9:
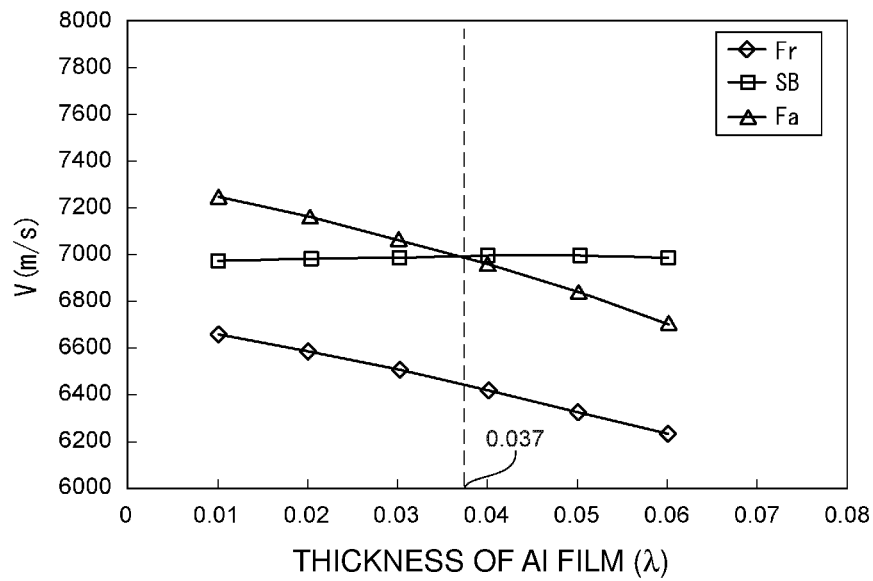
FIG. 9 is a graph showing the relationship between the thickness of the Al film and the acoustic velocity at each of the resonant frequency Fr, the frequency SB at the upper stop band edge, and the anti-resonant frequency Fa when the Euler angles of lithium niobate are (0°, 30°, 90°) and the thickness of the piezoelectric body made of lithium niobate is about 0.20λ.
Figure 10:
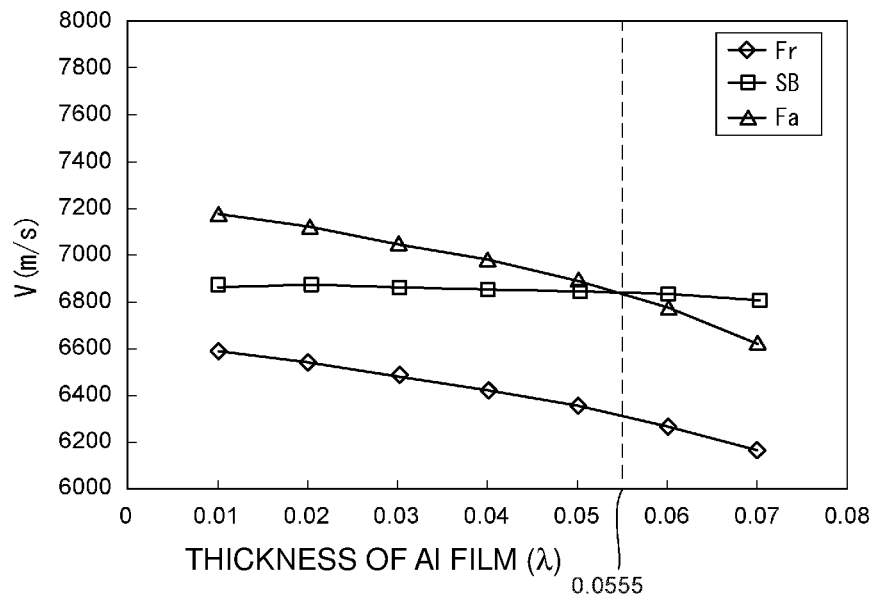
FIG. 10 is a graph showing the relationship between the thickness of the Al film and the acoustic velocity at each of the resonant frequency Fr, the frequency SB at the upper stop band edge, and the anti-resonant frequency Fa when the Euler angles of lithium niobate are (0°, 30°, 90°) and the thickness of the piezoelectric body made of lithium niobate is about 0.30λ.

FIGS. 8 to 10 show changes in the acoustic velocity at the resonant frequency Fr, the frequency SB at the upper stop band edge, and the anti-resonant frequency Fa when, in the structure of Example 2 using lithium niobate with Euler angles of (0°, 30°, 90°), the thickness of the Al film and the thickness of the piezoelectric body made of lithium niobate were changed. FIG. 8 shows the results when lithium niobate with Euler angles of (0°, 30°, 90°) was used and the thickness of the piezoelectric body made of the lithium niobate was about 0.10λ. FIG. 9 shows the results when the lithium niobate with Euler angles of (0°, 30°, 90°) was used and the thickness of the piezoelectric body made of the lithium niobate was about 0.20λ. FIG. 10 shows the results when the lithium niobate with Euler angles of (0°, 30°, 90°) was used and the thickness of the piezoelectric body made of the lithium niobate was about 0.30λ.

In FIG. 8, the anti-resonant frequency Fa and the frequency SB at the upper stop band edge coincide with each other when the thickness of the Al film is about 0.020λ. In FIG. 9, the anti-resonant frequency Fa and the frequency SB at the upper stop band edge coincide with each other when the thickness of the Al film is about 0.037λ. In FIG. 10, the anti-resonant frequency Fa and the frequency SB at the upper stop band edge coincide with each other when the thickness of the Al film is about 0.0555λ.

Figure 11:
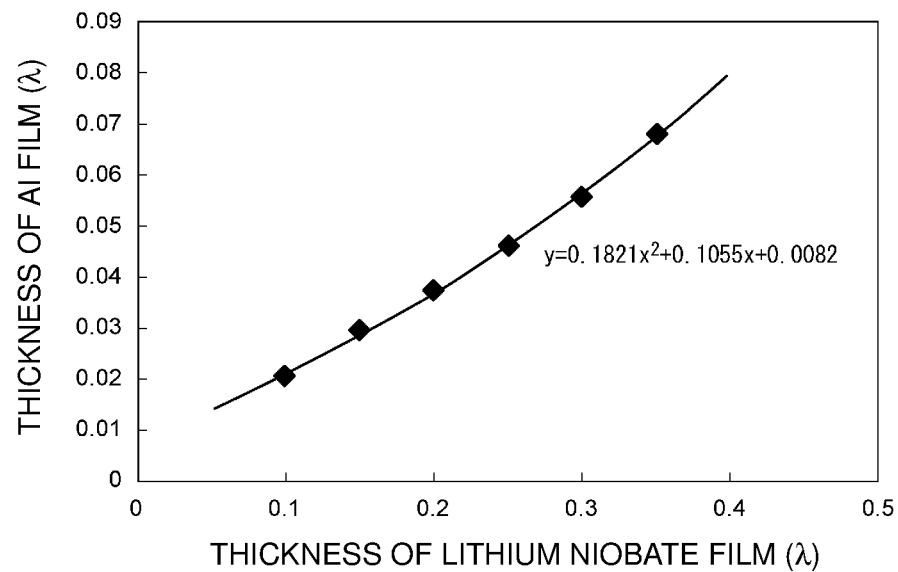
FIG. 11 is a graph showing the relationship between the thickness of the Al film and the thickness of a lithium niobate film when the anti-resonant frequency Fa coincides with the frequency SB of the upper stop band edge.

FIG. 11 is a graph showing the relationship between the thickness of the lithium niobate film and the thickness of the Al film when the anti-resonant frequency Fa and the frequency SB at the upper stop band edge coincide with each other as described in FIGS. 8 to 10.

As is clear from FIG. 11, the anti-resonant frequency Fa and the frequency SB at the upper stop band edge coincide on a curve represented by $y=0.1821x^2+0.1055x+0.0082$, where y(λ) is the thickness of the Al film and x(λ) is the thickness of the lithium niobate film. When y is denoted by $T_{Al}$ and x is denoted by $T_{LN}$, the curve is represented by the following formula (4).

$$T_{Al}=0.1821 \times T_{LN}^2+0.1055 \times T_{LN}+0.0082 \qquad \text{formula (4)}$$

By increasing the film thickness of the IDT electrode 6 and reducing the thickness of the lithium niobate film forming the piezoelectric body 5, the reflection coefficient per electrode finger can be increased, and the spurious response can be shifted to the high-frequency side, as described above. Therefore, the influence of the spurious response can be reduced when the thickness of the Al film is larger than $T_{Al}$ represented by formula (4) above.

The reflection coefficient per electrode finger is approximately proportional to the mass load from the electrodes. Therefore, when a metal having a higher density than Al is used for IDT electrode having the same reflection coefficient as the IDT electrode made of Al, the film thickness of the IDT electrode made of the above metal is smaller than the film thickness of the IDT electrode made of Al. When the film thickness of the IDT electrode that is normalized by the wavelength is $\lambda$, the density of the metal of the IDT electrode is $\rho$, the density of Al is $\rho_{Al}$, and the ratio of the density of the metal of the IDT electrode to the density of Al us $r=\rho/\rho_{Al}$. Then it is only necessary that the following formula (5) is satisfied.

$$T \times r \geq 0.1821 \times T_{LN}^2 + 0.1055 \times T_{LN} + 0.0082 \quad \text{formula (5)}$$

Therefore, in preferred embodiments of the present invention, it is preferable that formula (5) is satisfied. In this case, the influence of the spurious response can be further reduced.

EXAMPLES 4 AND 5

In Example 4, an acoustic wave device was produced in the same or substantially the same manner as in Example 1 except that the parameters of the acoustic wave device were changed as follows.

Piezoelectric body 5: lithium niobate, Euler angles=(0°, 90°, 90°)

Thickness of the Al film forming the IDT electrode 6=about 0.03$\lambda$

Duty ratio=about 0.50

Thickness of the piezoelectric body 5=about 0.2$\lambda$

In the acoustic reflection layer, SiO$_2$ films with a thickness of about 0.14$\lambda$ were used as the low-acoustic impedance layers 3a, 3c, and 3e, as in Example 1. Pt films with a thickness of about 0.09$\lambda$ were used as the high-acoustic impedance layers 3b and 3d. Si was used for the supporting substrate 2.

For comparison purposes, an acoustic wave device in Example 5 was obtained in the same or substantially the same manner as in Example 4 except that the thickness of the Al film was about 0.005$\lambda$.

Figure 12:
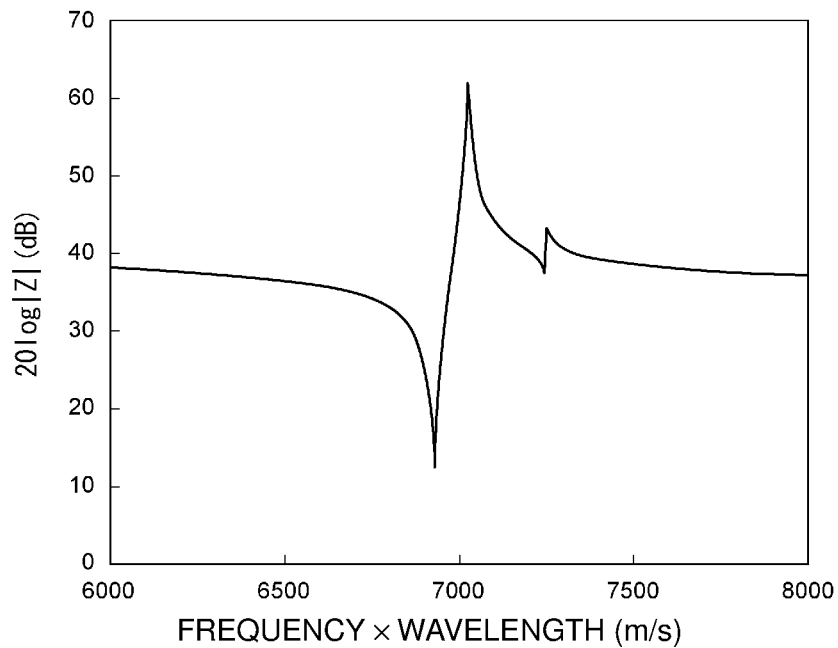
FIG. 12 is a graph showing the resonance characteristics in Example 4 when the Euler angles of lithium niobate are (0°, 90°, 90°) and the thickness of the Al film is about 0.03λ.
Figure 13:
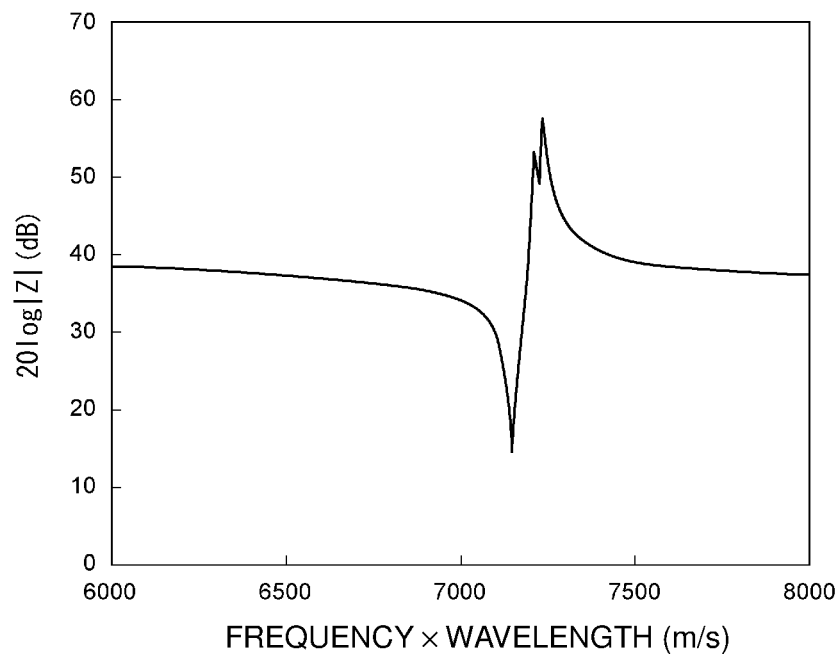
FIG. 13 is a graph showing the resonance characteristics in Example 5 when the Euler angles of lithium niobate are (0°, 90°, 90°) and the thickness of the Al film is about 0.005λ.

FIG. 12 is a graph showing the resonance characteristics of the acoustic wave device in Example 4. FIG. 13 is a graph showing the resonance characteristics of the acoustic wave device in Example 5.

As is clear from FIG. 13, in Example 5, a spurious response appears between the resonant frequency and the anti-resonant frequency. However, as shown in FIG. 12, in Example 4, the spurious response is located on the high-frequency side of the anti-resonant frequency.

Figure 14:
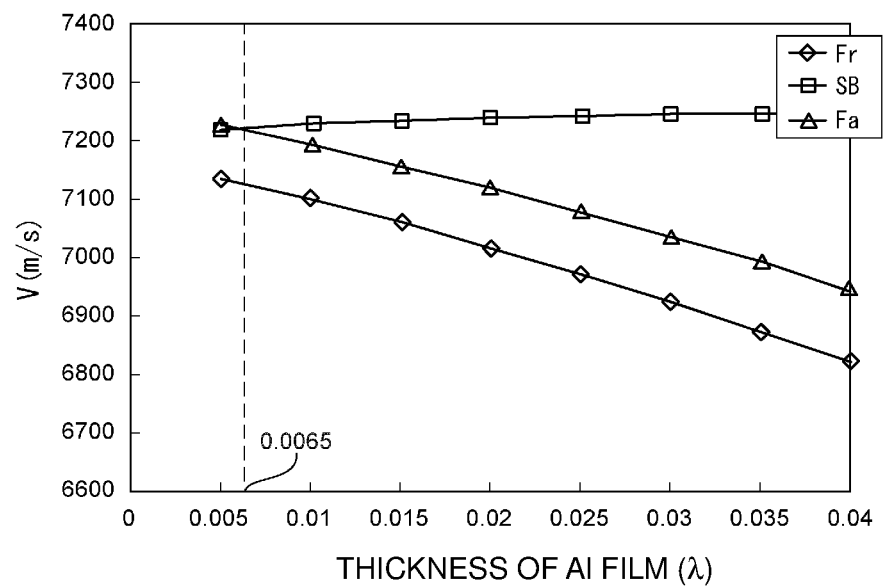
FIG. 14 is a graph showing the relationship between the thickness of the Al film and the acoustic velocity at each of the resonant frequency Fr, the frequency SB at the upper stop band edge, and the anti-resonant frequency Fa when the Euler angles of lithium niobate are (0°, 90°, 90°) and the thickness of the piezoelectric body formed of lithium niobate is about 0.20λ.
Figure 15:
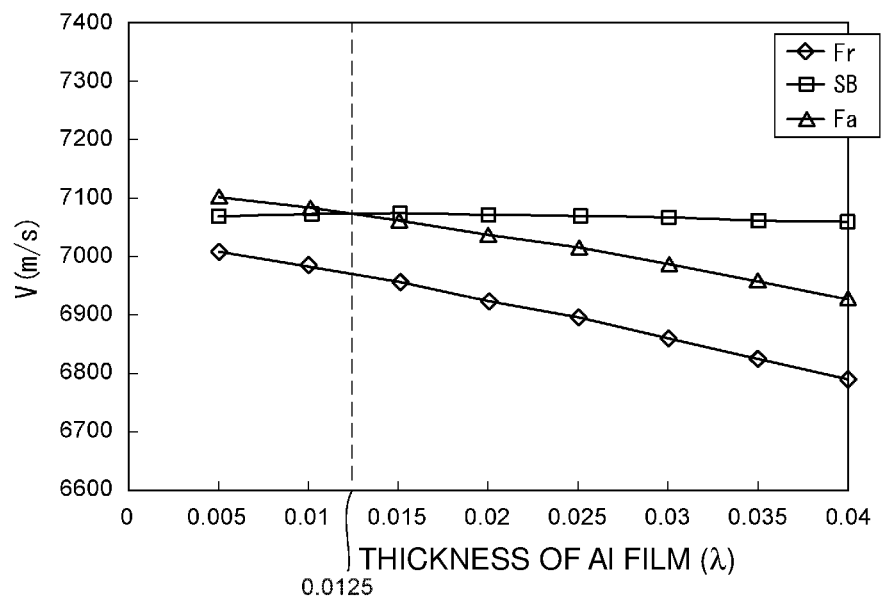
FIG. 15 is a graph showing the relationship between the thickness of the Al film and the acoustic velocity at each of the resonant frequency Fr, the frequency SB at the upper stop band edge, and the anti-resonant frequency Fa when the Euler angles of lithium niobate are (0°, 90°, 90°) and the thickness of the piezoelectric body formed of lithium niobate is about 0.30λ.
Figure 16:
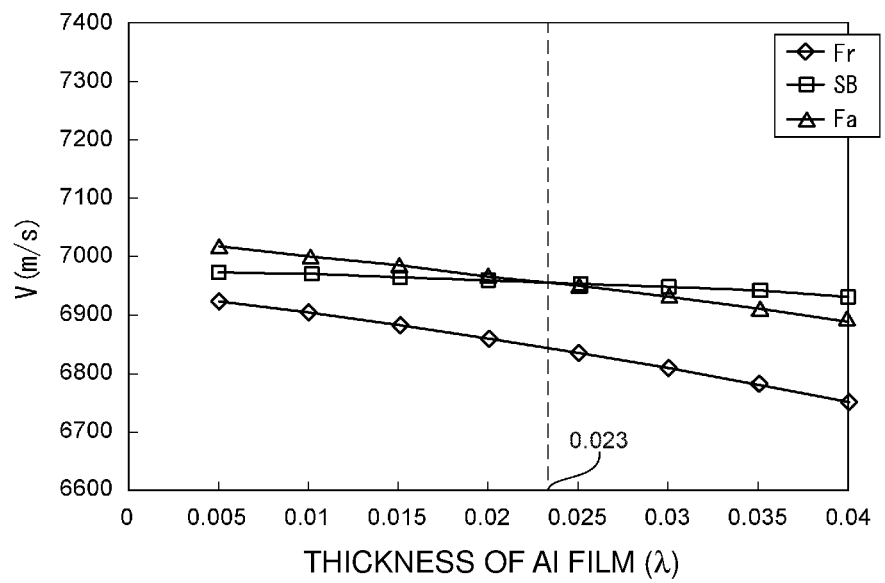
FIG. 16 is a graph showing the relationship between the thickness of the Al film and the acoustic velocity at each of the resonant frequency Fr, the frequency SB at the upper stop band edge, and the anti-resonant frequency Fa when the Euler angles of lithium niobate are (0°, 90°, 90°) and the thickness of the piezoelectric body formed of lithium niobate is about 0.35λ.
Figure 17:
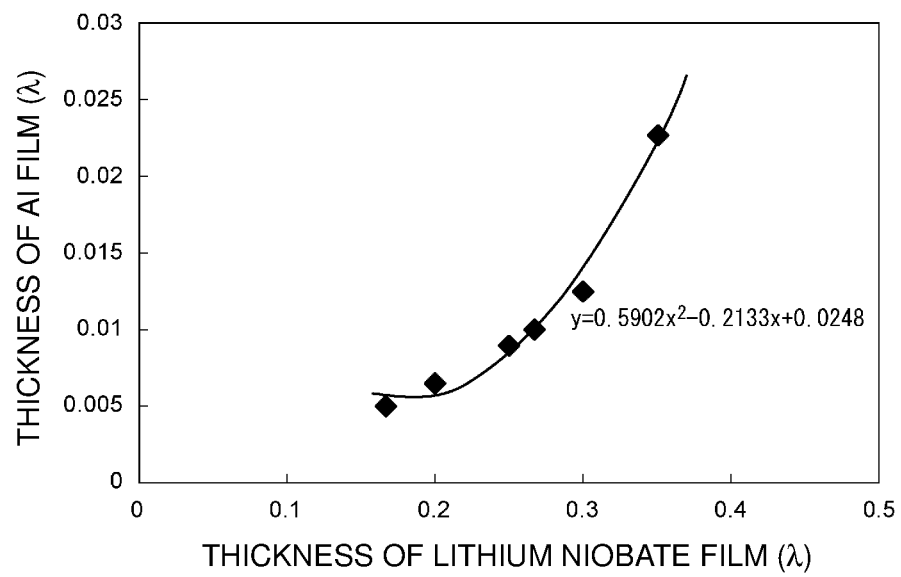
FIG. 17 is a graph showing the relationship between the thickness of the Al film and the thickness of the lithium niobate film when the anti-resonant frequency Fa coincides with the frequency SB of the upper stop band edge in the case where the Euler angles of lithium niobate are (0°, 90°, 90°).

In Example 4 also, with the Euler angles of lithium niobate fixed to (0°, 90°, 90°), different acoustic wave devices with different thicknesses of the Al film and different thicknesses of the piezoelectric body made of lithium niobate were produced. The acoustic velocities at the resonant frequency Fr, the anti-resonant frequency Fa, and the frequency SB at the upper stop band edge in the acoustic wave devices were determined. FIG. 14 shows the results when the thickness of the piezoelectric body made of lithium niobate was about 0.20$\lambda$. FIG. 15 shows the results when the thickness of the piezoelectric body made of lithium niobate was about 0.30$\lambda$. FIG. 16 shows the results when the thickness of the piezoelectric body made of lithium niobate was about 0.35$\lambda$. In FIG. 14, the anti-resonant frequency Fa and the frequency SB at the upper stop band edge coincide with each other when the thickness of the Al film is about 0.0065$\lambda$. In FIG. 15, the anti-resonant frequency Fa and the frequency SB at the upper stop band edge coincide with each other when the thickness of the Al film is about 0.0125$\lambda$. In FIG. 16, the anti-resonant frequency Fa and the frequency SB at the upper stop band edge coincide with each other when the thickness of the Al film is about 0.023$\lambda$. The results are plotted to obtain a curve shown in FIG. 17. FIG. 17 shows the relationship between the thickness of the lithium niobate film and the thickness of the Al film when the anti-resonant frequency Fa and the frequency SB at the upper stop band edge coincide with each other in Example 4, i.e., when lithium niobate with Euler angles of (0°, 90°, 90°) was used. The curve shown in FIG. 17 is represented by y=0.5902x$^2$−0.2133x+0.0248, where x($\lambda$) is the thickness of the lithium niobate film, and y($\lambda$) is the thickness of the Al film.

When the thickness of the Al film is denoted by $T_{Al}$ and the film thickness of lithium niobate is denoted by $T_{LN}$, the curve is represented by $T_{Al}=0.5902 \times T_{LN}^2 - 0.2133 \times T_{LN} + 0.0248$.

By increasing the film thickness of the IDT electrode 6 and reducing the thickness of the lithium niobate film of the piezoelectric body 5, the reflection coefficient per electrode finger can be increased, and the spurious response can be shifted to the high-frequency side, as described above. Therefore, the influence of the spurious response can be reduced when the thickness of the Al film is larger than $T_{Al}$ represented by the above formula.

The reflection coefficient per electrode finger is approximately proportional to the mass load from the electrodes. Therefore, when a metal having a higher density than Al is used for IDT electrode having the same reflection coefficient as the IDT electrode made of Al, the film thickness of the IDT electrode made of the above metal is smaller than the film thickness of the IDT electrode made of Al. When the film thickness of the IDT electrode that is normalized by the wavelength is $\lambda$, the density of the metal of the IDT electrode is $\rho$, the density of Al is $\rho_{Al}$, and the ratio of the density of the metal of the IDT electrode to the density of Al is $r=\rho/\rho_{Al}$. Then it is only necessary that the following formula (6) is satisfied.

$$T \times r \geq 0.5902 \times T_{LN}^2 - 0.2133 \times T_{LN} + 0.0248 \quad \text{formula (6)}$$

In this case, the influence of the spurious response can be further reduced.

EXAMPLES 6 AND 7

In Example 6, an acoustic wave device was produced in the same manner as in Example 1 except that the parameters of the acoustic wave device were changed as follows.

Piezoelectric body 5: lithium niobate, Euler angles=(0°, 125°, 90°)

Thickness of the Al film forming the IDT electrode 6=about 0.04$\lambda$

Duty ratio=about 0.50

Thickness of the piezoelectric body 5=about 0.2$\lambda$

In the acoustic reflection layer, SiO$_2$ films with a thickness of about 0.14$\lambda$ were used as the low-acoustic impedance layers 3a, 3c, and 3e, as in Example 1. Pt films with a thickness of about 0.09λ were used as the high-acoustic impedance layers 3b and 3d. Si was used for the supporting substrate 2.

An acoustic wave device in Example 7 was obtained in the same or substantially the same manner as in Example 6 except that the thickness of the Al film was about 0.01λ.

Figure 18:
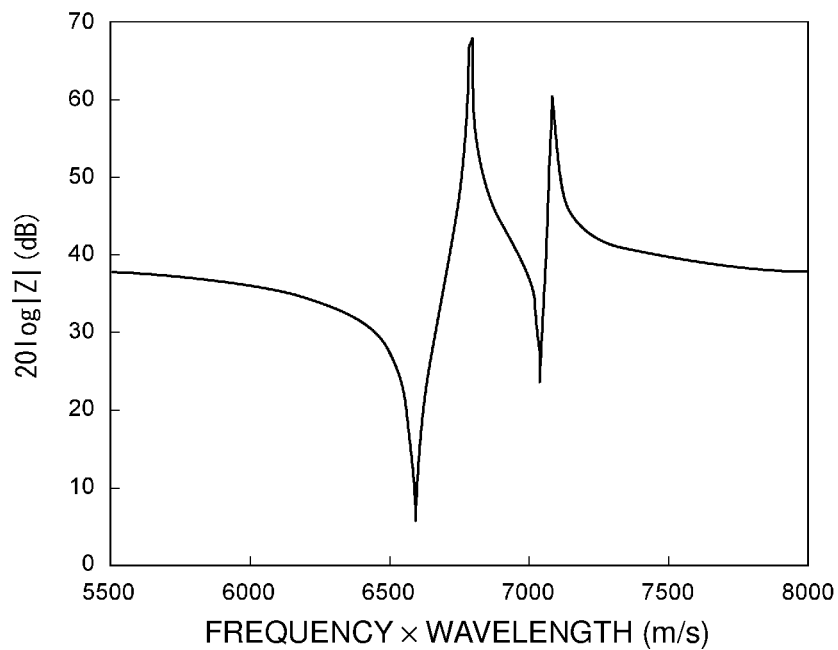
FIG. 18 is a graph showing the resonance characteristics in Example 6 when the Euler angles of lithium niobate are (0°, 125°, 90°) and the thickness of the Al film is about 0.04λ.
Figure 19:
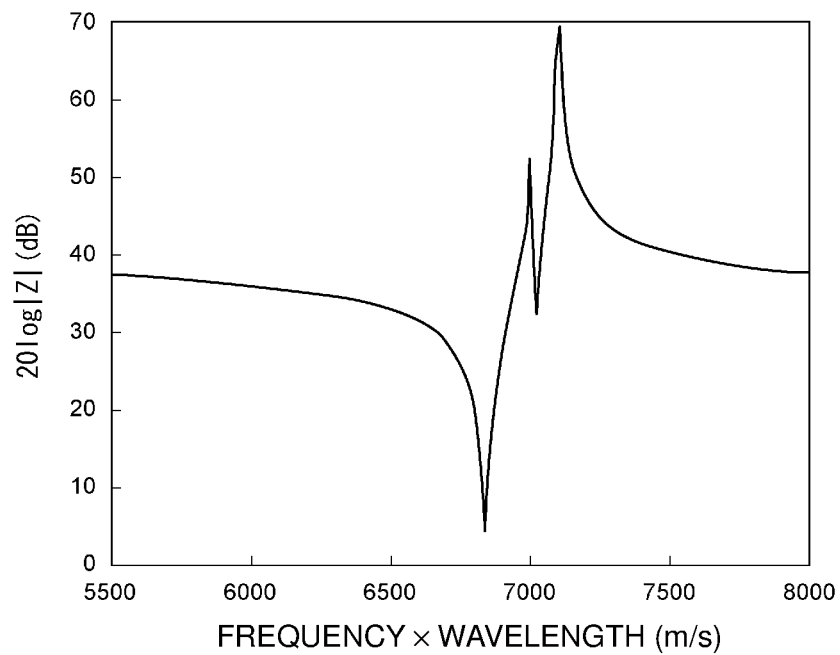
FIG. 19 is a graph showing the resonance characteristics in Example 7 when the Euler angles of lithium niobate are (0°, 125°, 90°) and the thickness of the Al film is about 0.01λ.

FIG. 18 is a graph showing the resonance characteristics of the acoustic wave device in Example 6. FIG. 19 is a graph showing the resonance characteristics of the acoustic wave device in Example 7.

As is clear from FIG. 19, in Example 7, a spurious response appears between the resonant frequency and the anti-resonant frequency. However, as shown in FIG. 18, in Example 6, the spurious response is located on the high-frequency side of the anti-resonant frequency.

Figure 20:
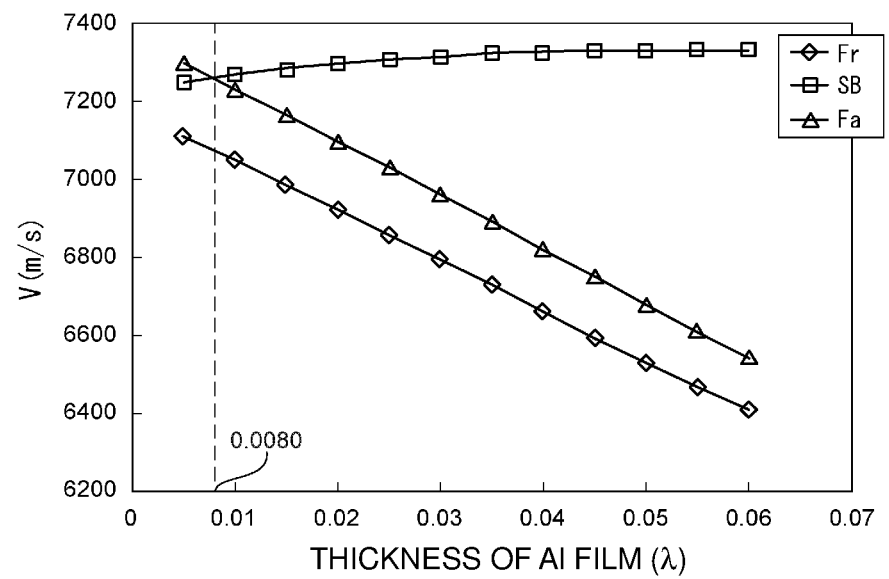
FIG. 20 is a graph showing the relationship between the thickness of the Al film and the acoustic velocity at each of the resonant frequency Fr, the frequency SB at the upper stop band edge, and the anti-resonant frequency Fa when the Euler angles of lithium niobate are (0°, 125°, 90°) and the thickness of the piezoelectric body formed of lithium niobate is about 0.10λ.
Figure 21:
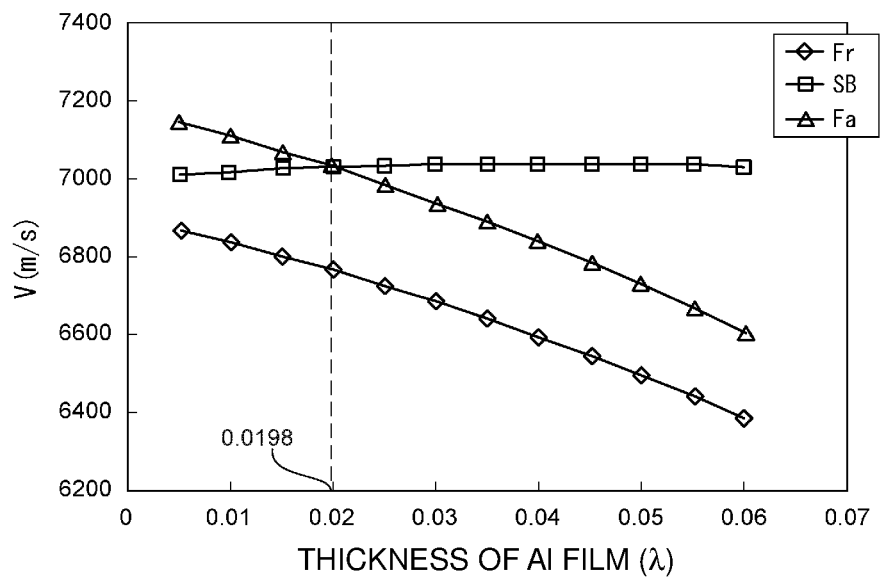
FIG. 21 is a graph showing the relationship between the thickness of the Al film and the acoustic velocity at each of the resonant frequency Fr, the frequency SB at the upper stop band edge, and the anti-resonant frequency Fa when the Euler angles of lithium niobate are (0°, 125°, 90°) and the thickness of the piezoelectric body formed of lithium niobate is about 0.20λ.
Figure 22:
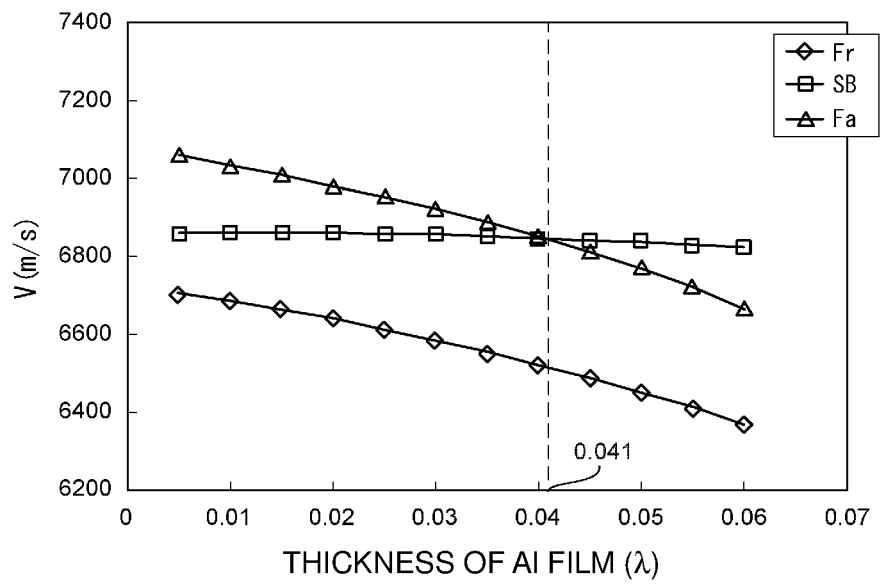
FIG. 22 is a graph showing the relationship between the thickness of the Al film and the acoustic velocity at each of the resonant frequency Fr, the frequency SB at the upper stop band edge, and the anti-resonant frequency Fa when the Euler angles of lithium niobate are (0°, 125°, 90°) and the thickness of the piezoelectric body formed of lithium niobate is about 0.30λ.
Figure 23:
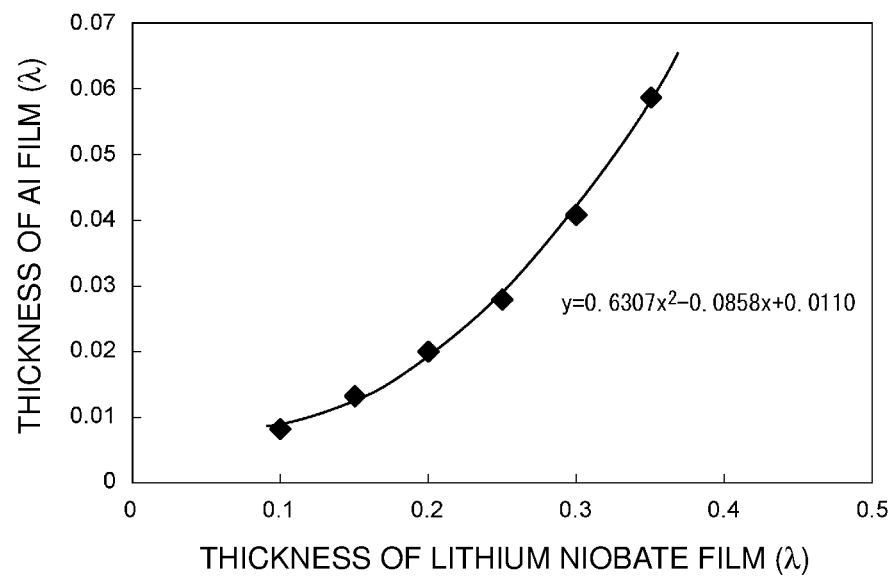
FIG. 23 is a graph showing the relationship between the thickness of the Al film and the thickness of the lithium niobate film when the anti-resonant frequency Fa coincides with the frequency SB of the upper stop band edge in the case where the Euler angles of lithium niobate are (0°, 125°, 90°).

In Example 6 also, with the Euler angles of lithium niobate fixed to (0°, 125°, 90°), different acoustic wave devices with different thicknesses of the Al film and different thicknesses of the piezoelectric body made of lithium niobate were produced. The acoustic velocities at the resonant frequency Fr, the anti-resonant frequency Fa, and the frequency SB at the upper stop band edge in the acoustic wave devices were determined. FIG. 20 shows the results when the thickness of the piezoelectric body made of lithium niobate was about 0.10λ. FIG. 21 shows the results when the thickness of the piezoelectric body made of lithium niobate was about 0.20λ. FIG. 22 shows the results when the thickness of the piezoelectric body made of lithium niobate was about 0.30λ. In FIG. 20, the anti-resonant frequency Fa and the frequency SB at the upper stop band edge coincide with each other when the thickness of the Al film is about 0.0080λ. In FIG. 21, the anti-resonant frequency Fa and the frequency SB at the upper stop band edge coincide with each other when the thickness of the Al film is about 0.0198λ. In FIG. 22, the anti-resonant frequency Fa and the frequency SB at the upper stop band edge coincide with each other when the thickness of the Al film is about 0.041λ. The results are plotted to obtain a curve shown in FIG. 23. FIG. 23 shows the relationship between the thickness of the lithium niobate film and the thickness of the Al film when the anti-resonant frequency Fa and the frequency SB at the upper stop band edge coincide with each other in Example 6, i.e., when lithium niobate with Euler angles of (0°, 125°, 90°) was used. The curve shown in FIG. 23 is represented by $y=0.6307x^2-0.0858x+0.0110$, where $x(\lambda)$ is the thickness of the lithium niobate film, and $y(\lambda)$ is the thickness of the Al film.

When the thickness of the Al film is denoted by $T_{Al}$ and the film thickness of lithium niobate is denoted by $T_{LN}$, the curve is represented by $T_{Al}=0.6307\times T_{LN}^2-0.0858\times T_{LN}+0.0110$.

By increasing the film thickness of the IDT electrode 6 and reducing the thickness of the lithium niobate film of the piezoelectric body 5, the reflection coefficient per electrode finger can be increased, and the spurious response can be shifted to the high-frequency side, as described above. Therefore, the influence of the spurious response can be reduced when the thickness of the Al film is larger than $T_{Al}$ represented by the above formula.

The reflection coefficient per electrode finger is approximately proportional to the mass load from the electrodes. Therefore, when a metal having a higher density than Al is used for IDT electrode having the same reflection coefficient as the IDT electrode made of Al, the film thickness of the IDT electrode made of the above metal is smaller than the film thickness of the IDT electrode made of Al. When the film thickness of the IDT electrode that is normalized by the wavelength is λ, the density of the metal forming the IDT electrode is ρ, the density of Al is $\rho_{Al}$, and the ratio of the density of the metal of the IDT electrode to the density of Al is $r=\rho/\rho_{Al}$. Then it is only necessary that the following formula (7) is satisfied.

$$T\times r \geq 0.6307\times T_{LN}^2-0.0858\times T_{LN}+0.0110 \qquad \text{formula (7)}$$

In this case, the influence of the spurious response can be further reduced.

EXAMPLE 8

In Example 8, acoustic wave devices were produced with the design parameters of the acoustic wave device 1 in the first preferred embodiment set as follows. In Example 8, the number of layers stacked in the acoustic reflection layer 3 was changed.

Piezoelectric body 5: lithium niobate, Euler angles=(0°, 30°, 90°)

Thickness of the IDT electrode 6 formed of Al=about 0.06λ

Duty ratio=about 0.50

Thickness of the piezoelectric body 5=about 0.2λ

Supporting substrate=Si

The acoustic reflection layer was prepared by alternately stacking low-acoustic impedance layers made of $SiO_2$ and having a thickness of about 0.14λ and high-acoustic impedance layers made of Pt and having a thickness of about 0.09λ. The number of stacked layers was three, four, or seven. In a three-layer structure, a low-acoustic impedance layer, a high-acoustic impedance layer, and a low-acoustic impedance layer were stacked in this order on the piezoelectric body 5. In a four layer structure, a low-acoustic impedance layer, a high-acoustic impedance layer, a low-acoustic impedance layer, and a high-acoustic impedance layer were stacked in this order on the piezoelectric body 5. In a seven layer structure, a low-acoustic impedance layer, a high-acoustic impedance layer, a low-acoustic impedance layer, a high-acoustic impedance layer, a low-acoustic impedance layer, a high-acoustic impedance layer, and a low-acoustic impedance layer were stacked in this order on the piezoelectric body 5.

Figure 24:
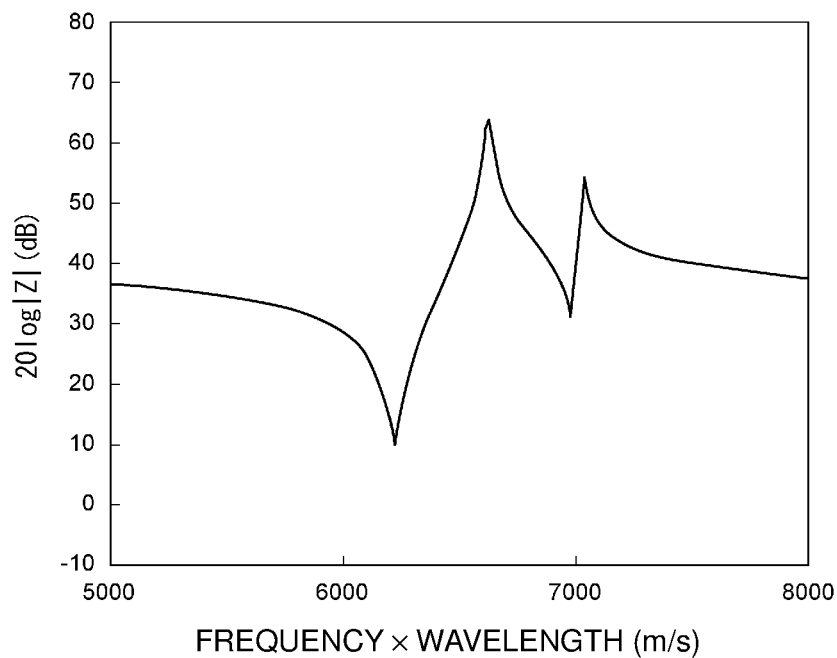
FIG. 24 is a graph showing the resonance characteristics when the number of layers stacked in an acoustic reflection layer is three.
Figure 25:
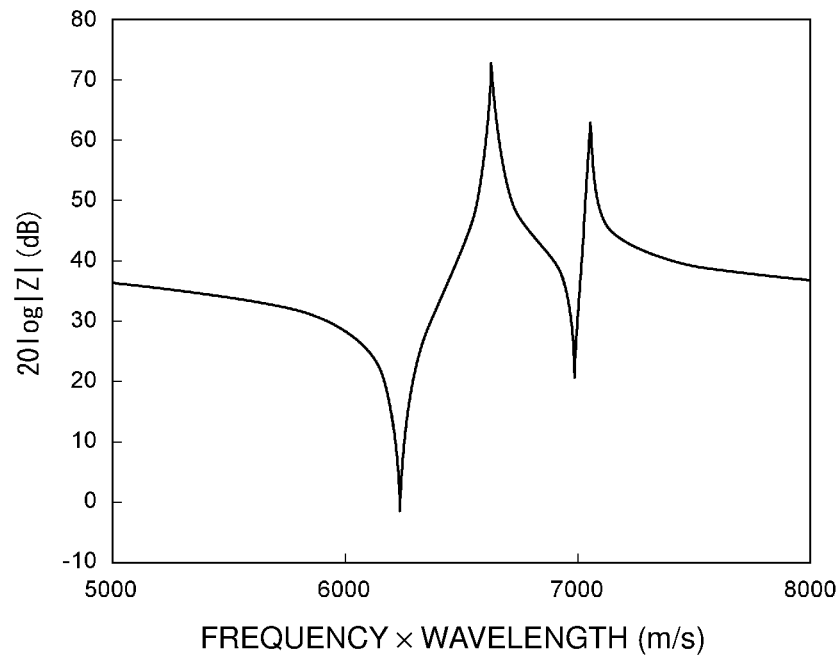
FIG. 25 is a graph showing the resonance characteristics when the number of layers stacked in the acoustic reflection layer is four.
Figure 26:
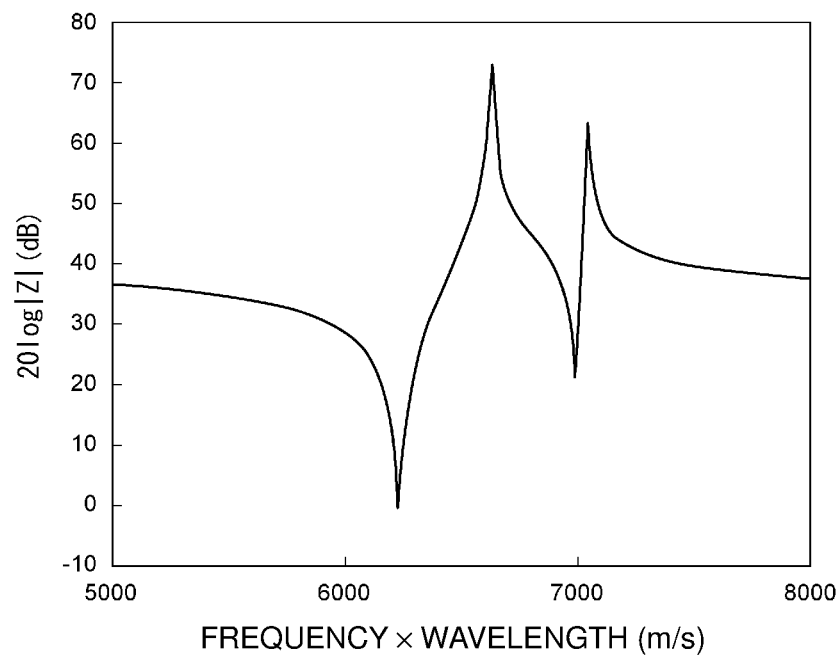
FIG. 26 is a graph showing the resonance characteristics when the number of layers stacked in the acoustic reflection layer is seven.

FIG. 24 is a graph showing the resonance characteristics of the acoustic wave device in which the number of layers stacked in the acoustic reflection layer is three. FIG. 25 is a graph showing the resonance characteristics of the acoustic wave device in which the number of layers stacked in the acoustic reflection layer is four. FIG. 26 is a graph showing the resonance characteristics of the acoustic wave device in which the number of layers stacked in the acoustic reflection layer is seven.

As can be seen by comparing FIGS. 24 to 26, when the acoustic reflection layer includes three layers, the impedance curve is blunted at the resonant frequency and the anti-resonant frequency. However, when the acoustic reflection layer includes four or more layers, the peaks of the impedance at the resonant frequency and the anti-resonant frequency are acute.

Figure 27:
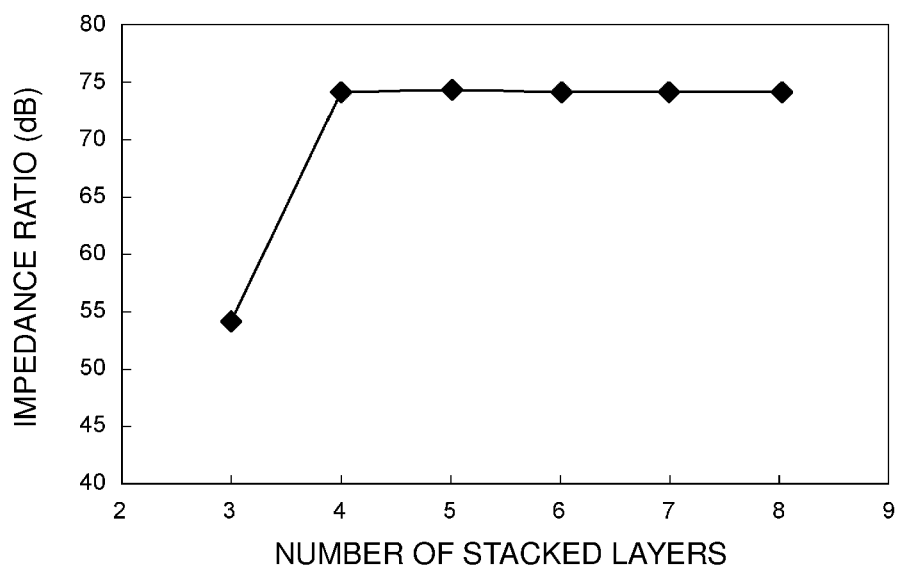
FIG. 27 is a graph showing the relationship between the number of layers stacked in the acoustic reflection layer and the impedance ratio.

FIG. 27 is a graph showing the relationship between the number of layers stacked in the acoustic reflection layer and an impedance ratio. As can be seen, the impedance ratio, i.e., the ratio of the impedance at the anti-resonant frequency to the impedance at the resonant frequency, is large when the number of stacked layers is four or more. Therefore, preferably, the number of layers stacked in the acoustic reflection layer is four or more. In this case, S0 mode acoustic plate waves are sufficiently reflected by the acoustic reflection layer, and the plate wave S0 mode may be effectively confined within the piezoelectric body 5.

In Examples 1 to 8, one-port acoustic wave resonators have been described above. However, the present invention is not limited to the one-port acoustic wave resonators and is applicable to other acoustic wave devices, such as longitudinally coupled resonators.

In preferred embodiments of the present invention, crystallographically equivalent Euler angles (φ, θ, Ψ) of LiNbO$_3$ may be used. For example, according to a document (The Journal of the Acoustical Society of Japan Vol. 36, No. 3, 1980, pp. 140 to 145), LiNbO$_3$ is a trigonal crystal belonging to point group 3$m$, and the following formula holds.

$$F(\phi, \theta, \psi) = F(60° + \phi, -\theta, \psi)$$
$$= F(60° - \phi, -\theta, 180° - \psi)$$
$$= F(\phi, 180° + \theta, 180° - \psi)$$
$$= F(\phi, \theta, 180° + \psi)$$

Here, F is an acoustic wave characteristic such as the electromechanical coupling coefficient, propagation loss, TCF, or PFA, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a supporting substrate;
    a piezoelectric body made of lithium niobate and disposed directly or indirectly on the supporting substrate; and
    an IDT electrode disposed directly or indirectly on the piezoelectric body; wherein
    the acoustic wave device uses a plate wave S0 mode propagating in the piezoelectric body;
    a thickness of the piezoelectric body is equal to or less than about 1λ, where λ is a wavelength of an acoustic wave, the wavelength being determined by a pitch of electrode fingers of the IDT electrode;
    Euler angles of the lithium niobate are (0°±10°, θ, 90°±10°); and
    θ is within a range of from about 0° to about 180° inclusive.

2. The acoustic wave device according to claim 1, further comprising:
    an acoustic reflection layer that supports the piezoelectric body and is disposed between the supporting substrate and the piezoelectric body; wherein
    the acoustic reflection layer includes a low-acoustic impedance layer having a lower acoustic impedance and a high-acoustic impedance layer having a higher acoustic impedance.

3. The acoustic wave device according to claim 2, wherein the low-acoustic impedance layer is made of SiO$_2$.

4. The acoustic wave device according to claim 2, wherein the high-acoustic impedance layer is made of Pt.

5. The acoustic wave device according to claim 1, wherein θ is within a range of from about 7° to about 66° inclusive.

6. The acoustic wave device according to claim 5, wherein T×r satisfies T×r≥0.1821×T$_{LN}^2$+0.1055×T$_{LN}$+0.0082, where T$_{LN}$ is a thickness of the piezoelectric body that is normal- ized by the wavelength λ of the acoustic wave, T is a film thickness of the IDT electrode that is normalized by the wavelength λ of the acoustic wave, ρ is a density of a metal of the IDT electrode, ρ$_{Al}$ is a density of Al, and r is ρ/ρ$_{Al}$, which is a ratio of the density of the metal of the IDT electrode to the density of Al.

7. The acoustic wave device according to claim 1, wherein θ is within a range of from about 67° to about 104° inclusive.

8. The acoustic wave device according to claim 7, wherein T×r satisfies T×r≥0.5902×T$_{LN}^2$−0.2133×T$_{LN}$+0.0248, where T$_{LN}$ is a thickness of the piezoelectric body that is normalized by the wavelength λ of the acoustic wave, T is a film thickness of the IDT electrodes that is normalized by the wavelength λ of the acoustic wave, ρ is a density of a metal of the IDT electrode, ρ$_{Al}$ is a density of Al, and r is ρ/ρ$_{Al}$, which is a ratio of the density of the metal forming the IDT electrode to the density of Al.

9. The acoustic wave device according to claim 1, wherein θ is within a range of from about 116° to about 137° inclusive.

10. The acoustic wave device according to claim 9, wherein T×r satisfies T×r≥0.6307×T$_{LN}^2$−0.0858×T$_{LN}$+0.0110, where T$_{LN}$ is a thickness of the piezoelectric body that is normalized by the wavelength λ of the acoustic wave, T is a film thickness of the IDT electrode that is normalized by the wavelength λ of the acoustic wave, ρ is a density of a metal of the IDT electrode, ρ$_{Al}$ is a density of Al, and r is ρ/ρ$_{Al}$, which is a ratio of the density of the metal forming the IDT electrode to the density of Al.

11. The acoustic wave device according to claim 1, wherein the supporting substrate is made of a high-acoustic velocity material in which an acoustic velocity of a bulk wave propagating therein is higher than an acoustic velocity of an acoustic wave propagating in the piezoelectric body.

12. The acoustic wave device according to claim 11, further comprising a low-acoustic velocity material layer in which the acoustic velocity of a bulk wave propagating therein is lower than the acoustic velocity of the acoustic wave propagating in the piezoelectric body, the low-acoustic velocity material layer being stacked between the high-acoustic velocity material and the piezoelectric body.

13. The acoustic wave device according to claim 1, further comprising a layer made of a high-acoustic velocity material in which an acoustic velocity of a bulk wave propagating therein is higher than an acoustic velocity of an acoustic wave propagating in the piezoelectric body, the layer being stacked between the supporting substrate and the piezoelectric body.

14. The acoustic wave device according to claim 13, wherein the high-acoustic velocity material is at least one of Al$_2$O$_3$, SiN, AlN, SiC, diamond-like carbon, diamond, a metal, or a semiconductor.

15. The acoustic wave device according to claim 1, wherein the acoustic wave device includes a cavity between the supporting substrate and the piezoelectric body at a position of the IDT electrode in plan view.

16. The acoustic wave device according to claim 1, further comprising reflectors disposed on opposite sides of the IDT electrode in a propagation direction of acoustic waves.

17. The acoustic wave device according to claim 1, wherein the supporting substrate is made of Si.

18. The acoustic wave device according to claim 1, further comprising:
    an acoustic reflection layer that supports the piezoelectric body and is disposed between the supporting substrate and the piezoelectric body; wherein the acoustic reflection layer includes a first low-acoustic impedance layer having a lower acoustic impedance, a high-acoustic impedance layer having a higher acoustic impedance, and a second low-acoustic impedance layer stacked in this order on the piezoelectric body.

19. The acoustic wave device according to claim 1, further comprising:
an acoustic reflection layer that supports the piezoelectric body and is disposed between the supporting substrate and the piezoelectric body; wherein
the acoustic reflection layer includes a first low-acoustic impedance layer having a lower acoustic impedance, a first high-acoustic impedance layer having a higher acoustic impedance, a second low-acoustic impedance layer having a lower acoustic impedance, and a second high-acoustic impedance layer having a higher acoustic impedance stacked in this order on the piezoelectric body.

20. The acoustic wave device according to claim 1, further comprising:
an acoustic reflection layer that supports the piezoelectric body and is disposed between the supporting substrate and the piezoelectric body; wherein
the acoustic reflection layer includes a first low-acoustic impedance layer having a lower acoustic impedance, a first high-acoustic impedance layer having a higher acoustic impedance, a second low-acoustic impedance layer having a lower acoustic impedance, a second high-acoustic impedance layer having a higher acoustic impedance, a third low-acoustic impedance layer having a lower acoustic impedance, a third high-acoustic impedance layer having a higher acoustic impedance, and a fourth low-acoustic impedance layer having a lower acoustic impedance stacked in this order on the piezoelectric body.

* * * * *